(12) United States Patent
Takagi et al.

(10) Patent No.: US 10,520,745 B2
(45) Date of Patent: Dec. 31, 2019

(54) WAVELENGTH CONVERSION ELEMENT, LIGHT SOURCE DEVICE, AND PROJECTOR FOR REDUCING HEAT DAMAGE IN THE WAVELENGTH CONVERSION ELEMENT

(71) Applicant: SEIKO EPSON CORPORATION, Tokyo (JP)

(72) Inventors: Kunihiko Takagi, Okaya (JP); Tetsuo Shimizu, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/117,626

(22) Filed: Aug. 30, 2018

(65) Prior Publication Data

US 2019/0068936 A1   Feb. 28, 2019

(30) Foreign Application Priority Data

Aug. 31, 2017   (JP) ................. 2017-167031

(51) Int. Cl.
| | |
|---|---|
| G03B 27/14 | (2006.01) |
| G02B 27/28 | (2006.01) |
| H04N 9/31 | (2006.01) |
| H01S 5/06 | (2006.01) |
| G03B 21/28 | (2006.01) |
| G03B 21/14 | (2006.01) |

(Continued)

(52) U.S. Cl.
CPC ......... *G02B 27/283* (2013.01); *G03B 21/142* (2013.01); *G03B 21/28* (2013.01); *H01S 5/0609* (2013.01); *H04N 9/3161* (2013.01); *H04N 9/3167* (2013.01); *G02B 5/30* (2013.01); *G02B 27/0955* (2013.01)

(58) Field of Classification Search
CPC ............... H04N 9/3167; H04N 9/3161; G02B 27/1006; G02B 27/141; G02B 27/283; G02B 5/30; G02B 27/0955; G03B 21/142; G03B 21/28; H01S 5/0609
See application file for complete search history.

(56) References Cited

U.S. PATENT DOCUMENTS

| | | | | |
|---|---|---|---|---|
| 2004/0166035 A1* | 8/2004 | Noda | ...................... | B01D 53/94 422/180 |
| 2011/0149549 A1 | 6/2011 | Miyake | | |

(Continued)

FOREIGN PATENT DOCUMENTS

| | | |
|---|---|---|
| JP | 2011-129354 A | 6/2011 |
| JP | 2016-100090 A | 5/2016 |

*Primary Examiner* — Cara E Rakowski
*Assistant Examiner* — Magda Cruz
(74) *Attorney, Agent, or Firm* — Oliff PLC

(57) ABSTRACT

A wavelength conversion element includes a wavelength conversion layer having a first surface which excitation light enters, and a second surface opposed to the first surface, and adapted to perform wavelength conversion on the excitation light, a substrate disposed so as to be opposed to the second surface, and a bonding layer adapted to bond the wavelength conversion layer and the substrate to each other, and the bonding layer has a first bonding material disposed in a first region opposed to an incident area of the excitation light in the second surface, and a second bonding material disposed in at least a second region located on an outer periphery of the first region and lower in Young's modulus than the first bonding material.

18 Claims, 4 Drawing Sheets

(51) Int. Cl.
  *G02B 5/30* (2006.01)
  *G02B 27/09* (2006.01)

(56) References Cited

U.S. PATENT DOCUMENTS

2016/0138766 A1   5/2016  Owada
2016/0238922 A1*  8/2016  Furuyama ............ G02B 26/008
2017/0227192 A1*  8/2017  Ikeda ...................... F21V 29/89

* cited by examiner

WAVELENGTH CONVERSION ELEMENT, LIGHT SOURCE DEVICE, AND PROJECTOR FOR REDUCING HEAT DAMAGE IN THE WAVELENGTH CONVERSION ELEMENT

BACKGROUND

1. Technical Field

The present invention relates to a wavelength conversion element, a light source device, and a projector.

2. Related Art

In recent years, there exists a light source device having a solid-state light source such as a semiconductor laser, and a wavelength conversion element provided with a phosphor layer combined with each other. In such a light source device, the fluorescence conversion efficiency decreases as the temperature of the phosphor layer rises. For example, in the light source device disclosed in JP-A-2011-129354, the cooling efficiency of the phosphor is improved by bonding the phosphor layer to a heat radiation substrate with a metal bonding material.

However, in the light source device described above, since the expansion coefficient is different between the phosphor layer and the heat radiation substrate, there is a possibility that the phosphor layer is damaged or separated from the substrate due to the thermal stress caused when the phosphor layer generates heat.

SUMMARY

An advantage of some aspects of the invention is to provide a wavelength conversion element capable of reducing the damage due to the heat. Another advantage of some aspects of the invention is to provide a light source device equipped with the wavelength conversion element described above. Another advantage of some aspects of the invention is to provide a projector equipped with light source device described above.

According to a first aspect of the invention, a wavelength conversion element is provided. The wavelength conversion element includes a wavelength conversion layer having a first surface which excitation light enters, and a second surface opposed to the first surface, and adapted to perform wavelength conversion on the excitation light, a substrate disposed so as to be opposed to the second surface, and a bonding layer adapted to bond the wavelength conversion layer and the substrate to each other, wherein the bonding layer has a first bonding material disposed in a first region opposed to an incident area of the excitation light in the second surface, and a second bonding material disposed in at least a second region located on an outer periphery of the first region and lower in Young's modulus than the first bonding material.

According to the wavelength conversion element related to the first aspect of the invention, since the second bonding material lower in Young's modulus is disposed in the peripheral area (the second region) of the incident area of the excitation light where the displacement becomes large in the wavelength conversion layer, the thermal stress caused in the wavelength conversion layer can be reduced.

Therefore, according to the wavelength conversion element related to the aspect of the invention, it is possible to reduce the damage (the breakage of the wavelength conversion layer or the separation of the wavelength conversion layer from the substrate) due to the heat.

In the first aspect of the invention described above, it is preferable that thermal conductivity of the first bonding material is higher than thermal conductivity of the second bonding material.

According to this configuration, since the first bonding material high in thermal conductivity is disposed in the region heated to the highest temperature of the second surface of the wavelength conversion layer, it is possible to prevent the deterioration of the wavelength conversion efficiency of the wavelength conversion layer by suppressing the rise in temperature of the wavelength conversion layer.

In the first aspect of the invention described above, it is preferable that the first bonding material and the second bonding material are formed of the same material including voids, and a void ratio in the first bonding material is lower than a void ratio in the second bonding material.

According to this configuration, by controlling the void ratios, it is possible to form the first bonding material and the second bonding material using the same material. Therefore, since the bonding layer is formed of the single material, it is possible to achieve cost reduction compared to the case of using two materials.

In the first aspect of the invention described above, it is preferable that the wavelength conversion layer is formed of a ceramic phosphor.

According to this configuration, it is possible to provide the wavelength conversion element superior in heat resistance.

According to a second aspect of the invention, a light source device is provided. The light source device includes the wavelength conversion element according to the first aspect of the invention, and a light emitting element adapted to emit the excitation light.

The light source device according to the second aspect of the invention is capable of reducing the damage due to the heat, and at the same time preventing the deterioration of the wavelength conversion efficiency, and can therefore stably emit the light.

According to a third aspect of the invention, a projector is provided. The projector includes the light source device according to the second aspect of the invention described above, a light modulation device adapted to modulate light from the light source device in accordance with image information to form image light, and a projection optical device adapted to project the image light.

The projector according to the third aspect of the invention is equipped with the light source device in which the damage due to the heat is hard to occur, and the wavelength conversion efficiency is difficult to deteriorate, and therefore there is provided the projector high in luminance and high in reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Some embodiments of the invention will hereinafter be described in detail with reference to the drawings.

It should be noted that the drawings used in the following description show characteristic parts in an enlarged manner in some cases for the sake of convenience in order to make the features easy to understand, and the dimensional ratios between the constituents and so on are not necessarily the same as actual ones.

First Embodiment

Firstly, an example of a projector according to the present embodiment will be described.

Figure 1:
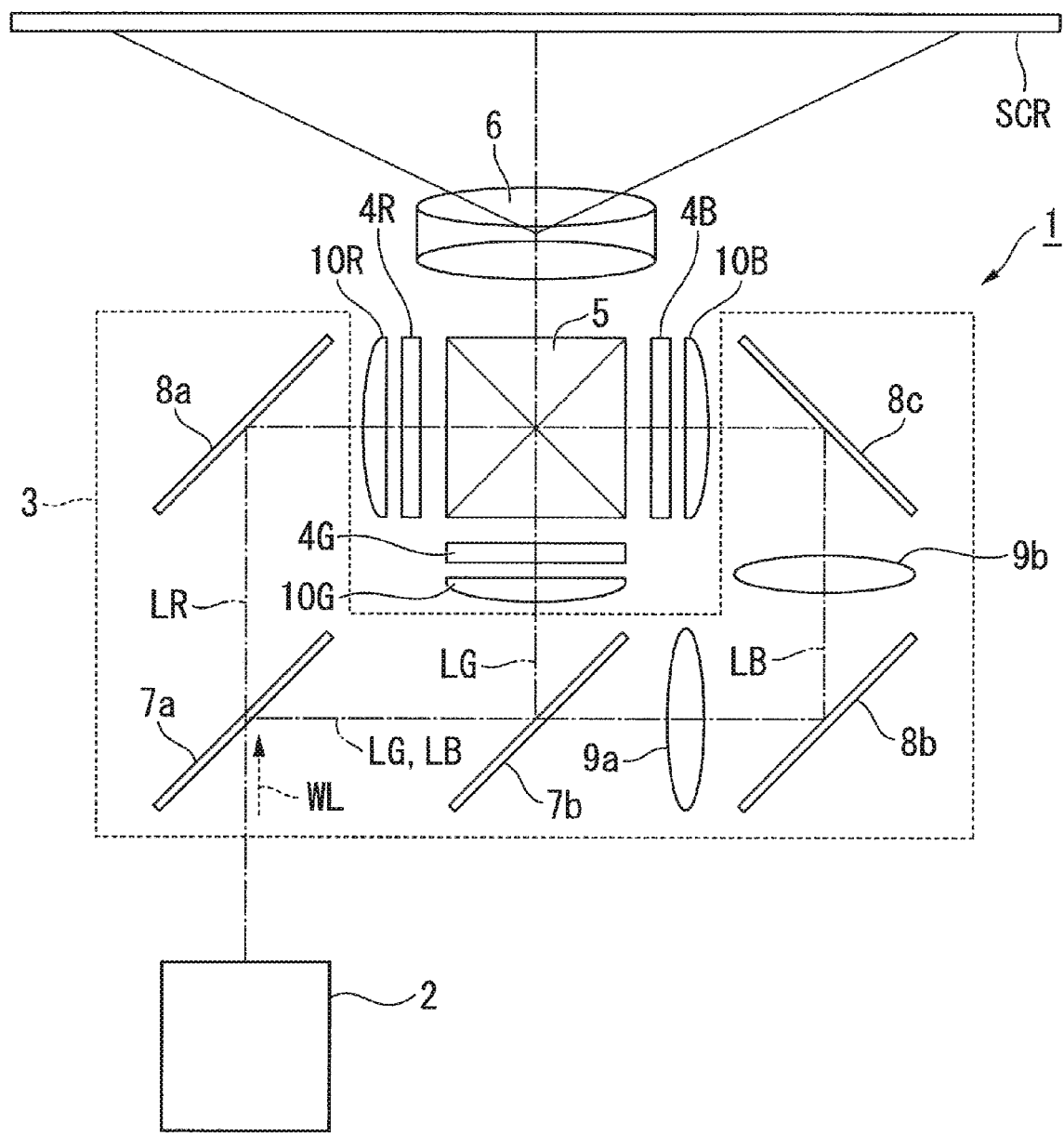
FIG. 1 is a diagram showing a schematic configuration of a projector according to a first embodiment of the invention.

FIG. 1 is a diagram showing a schematic configuration of the projector according to the present embodiment.

As shown in FIG. 1, the projector 1 according to the present embodiment is a projection-type image display device for displaying a color picture on a screen SCR. The projector 1 is provided with an illumination device 2, a color separation optical system 3, a light modulation device 4R, a light modulation device 4G, a light modulation device 4B, a combining optical device 5, and a projection optical device 6.

The color separation optical system 3 separates illumination light WL into red light LR, green light LG, and blue light LB. The color separation optical system 3 is provided with a first dichroic mirror 7a and a second dichroic mirror 7b, a first total reflection mirror 8a, a second total reflection mirror 8b, and a third total reflection mirror 8c, and a first relay lens 9a and a second relay lens 9b.

The first dichroic mirror 7a separates the illumination light WL from the illumination device 2 into the red light LR and the other light (the green light LG and the blue light LB). The first dichroic mirror 7a transmits the red light LR thus separated from, and at the same time, reflects the rest of the light. The second dichroic mirror 7b reflects the green light LG, and at the same time, transmits the blue light LB.

The first total reflection mirror 8a reflects the red light LR toward the light modulation device 4R. The second total reflection mirror 8b and the third total reflection mirror 8c guide the blue light LB to the light modulation device 4B. The green light LG is reflected from the second dichroic mirror 7b toward the light modulation device 4G.

The first relay lens 9a and the second relay lens 9b are disposed in the posterior stage of the second dichroic mirror 7b in the light path of the blue light LB.

The light modulation device 4R modulates the red light LR in accordance with image information to form red image light. The light modulation device 4G modulates the green light LG in accordance with the image information to form green image light. The light modulation device 4B modulates the blue light LB in accordance with the image information to form blue image light.

As the light modulation device 4R, the light modulation device 4G, and the light modulation device 4B, there are used, for example, transmissive liquid crystal panels. Further, on the incident side and the exit side of each of the liquid crystal panels, there are respectively disposed polarization plates (not shown).

Further, on the incident side of the light modulation device 4R, the light modulation device 4G, and the light modulation device 4B, there are disposed a field lens 10R, a field lens 10G, and a field lens 10B, respectively.

The image light from each of the light modulation device 4R, the light modulation device 4G, and the light modulation device 4B enters the combining optical device 5. The combining optical device 5 combines the image light, and then emits the image light thus combined toward the projection optical device 6. As the combining optical device 5, there is used, for example, a cross dichroic prism.

As the projection optical device 6, it is possible to adopt a combination lens constituted by, for example, a lens barrel, and a plurality of lenses disposed in the lens barrel. The projection optical device 6 projects the image light combined by the combining optical device 5 toward the screen SCR in an enlarged manner. Thus, the color picture enlarged is displayed on the screen SCR.

Illumination Device

Figure 2:
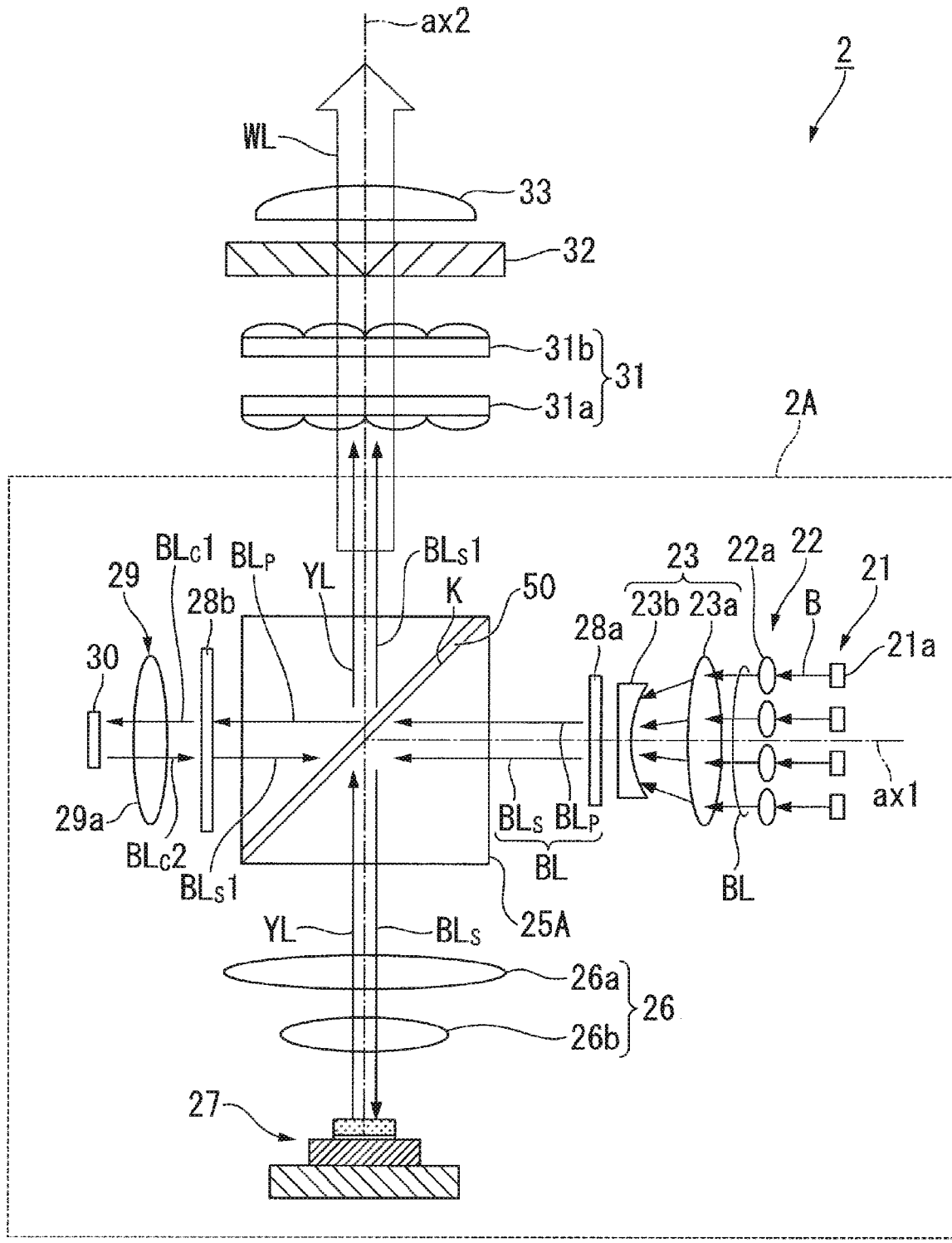
FIG. 2 is a diagram showing a schematic configuration of an illumination device.

Then, an illumination device 2 according to the present embodiment will be described. FIG. 2 is a diagram showing a schematic configuration of the illumination device 2. As shown in FIG. 2, the illumination device 2 is provided with a light source device 2A according to an embodiment of the invention, an integrator optical system 31, a polarization conversion element 32, and a superimposing lens 33.

The light source device 2A has an array light source 21, a collimator optical system 22, an afocal optical system 23, a first wave plate 28a, an optical element 25A including a polarization separation element 50, a first light collection optical system 26, a wavelength conversion element 27, a second wave plate 28b, a second light collection optical system 29, and a diffusely reflecting element 30.

In the light source device 2A, the array light source 21, the collimator optical system 22, the afocal optical system 23, the first wave plate 28a, the optical element 25A, the second wave plate 28b, the second light collection optical system 29, and the diffusely reflecting element 30 are disposed in series on an optical axis ax1. The wavelength conversion element 27, the first light collection optical system 26, the optical element 25A, the integrator optical system 31, the polarization conversion element 32, and the superimposing lens 33 are disposed in series on an optical axis ax2. The optical axis ax1 and the optical axis ax2 are located in the same plane, and are perpendicular to each other. The optical axis ax2 corresponds to the illumination light axis of the illumination device 2.

The array light source 21 is provided with a plurality of semiconductor lasers 21a. The plurality of semiconductor lasers 21a is disposed in an array in a plane perpendicular to the optical axis ax1. The semiconductor lasers 21a each emit, for example, a blue light beam B (e.g., a laser beam with a peak wavelength of 460 nm). The array light source 21 emits a pencil BL formed of a plurality of light beams B. In the present embodiment, the semiconductor lasers 21a correspond to a "light emitting element" in the appended claims.

The pencil BL emitted from the array light source 21 enters the collimator optical system 22. The collimator optical system 22 converts the light beams B emitted from the array light source 21 into parallel light beams. The collimator optical system 22 is formed of, for example, a plurality of collimator lenses 22a arranged in an array. The collimator lenses 22a are disposed so as to correspond respectively to the semiconductor lasers 21a.

The pencil BL having been transmitted through the collimator optical system 22 enters the afocal optical system 23. The afocal optical system 23 adjusts the light beam diameter of the pencil BL. The afocal optical system 23 is formed of, for example, a convex lens 23a and a concave lens 23b.

The pencil BL having been transmitted through the afocal optical system 23 enters the first wave plate 28a. The first wave plate 28a is, for example, a half-wave plate having an optical axis arranged to be able to rotate around the optical axis ax1. The pencil BL is linearly polarized light. By appropriately setting the rotational angle of the first wave plate 28a, it is possible to set the pencil BL having been transmitted through the first wave plate 28a to the light beam including the S-polarization component and the P-polarization component with respect to the polarization separation element 50 at a predetermined ratio.

The pencil BL, which includes the S-polarization component and the P-polarization component bypassing through the first wave plate 28a, enters the optical element 25A. The optical element 25A is formed of, for example, a dichroic prism having wavelength selectivity. The dichroic prism has a tilted surface K forming an angle of 45° with the optical axis ax1. The tilted surface K also forms an angle of 45° with the optical axis ax2. It should be noted that the type of the optical element 25A is not limited to a prism type, but can also be a plate type.

The tilted surface K is provided with the polarization separation element 50 having wavelength selectivity. The polarization separation element 50 has a polarization separation function of splitting the pencil BL into a pencil BLs as the S-polarization component with respect to the polarization separation element 50 and a pencil BLp as the P-polarization component. Specifically, the polarization separation element 50 reflects the pencil BLs as the S-polarization component, and transmits the pencil BLp as the P-polarization component.

Further, the polarization separation element 50 has a color separation function of transmitting fluorescence YL different in wavelength band from the pencil BL irrespective of the polarization state of the fluorescence YL. In other words, the polarization separation element 50 has the wavelength selective polarization separation characteristics of separating the S-polarization component and the P-polarization component from each other with respect to the light with the wavelength in a blue light band, but transmitting each of the S-polarized light and the R-polarized light with respect to the light with the wavelength in the green light band or the red light band.

The pencil BLs as the S-polarized light having been emitted from the polarization separation element 50 enters the first light collection optical system 26. The first light collection optical system 26 is constituted by, for example, a first lens 26a and a second lens 26b. The first light collection optical system 26 converges the pencil BLs toward the wavelength conversion element.

The wavelength conversion element 27 is a reflective wavelength conversion element 27 for converting the pencil BLs (excitation light) as the blue light entering the wavelength conversion element 27 from the first light collection optical system 26 into the fluorescence YL including the green light and the red light, and then emitting the fluorescence YL. It should be noted that the configuration of the wavelength conversion element 27 will be described later.

The fluorescence YL having been emitted from the wavelength conversion element 27 is collimated by the first light collection optical system 26, and then enters the polarization separation element 50. The fluorescence YL is non-polarized light, and the polarization separation element has the wavelength selective polarization separation characteristics. Therefore, the fluorescence YL passes through the first light collection optical system 26, then passes through the polarization separation element 50 along the optical axis ax2, and then propagates toward the integrator optical system 31.

Meanwhile, the pencil BLp as the P-polarized light having been emitted from the polarization separation element 50 is converted by the second wave plate 28b into blue light BLc1 as clockwise circularly polarized light, and then enters the second light collection optical system 29. The second wave plate 28b is formed of a quarter-wave plate.

The second light collection optical system 29 is formed of, for example, a lens 29a, and makes the blue light BLc1 enter the diffusely reflecting element 30 in a converged state.

The diffusely reflecting element 30 diffusely reflects the blue light BLc1, which has been emitted from the second light collection optical system 29, toward the polarization separation element 50. As the diffusely reflecting element 30, it is preferable to use an element of causing the Lambertian reflection of the blue light BLc1, and at the same time not disturbing the polarization state.

Hereinafter, the light diffusely reflected by the diffusely reflecting element 30 is referred to as blue light BLc2. According to the present embodiment, by diffusely reflecting the blue light BLc1, there can be obtained the blue light BLc2 having a roughly homogenous illuminance distribution. The blue light BLc1 as the clockwise circularly polarized light is reflected as the blue light BLc2 as counter-clockwise circularly polarized light.

The blue light BLc2 is converted by the second light collection optical system 29 into parallel light, and is then transmitted though the second wave plate 28b once again to be converted into the blue light BLs1 as the S-polarized light. The blue light BLs1 is reflected by the polarization separation element 50 toward the integrator optical system 31.

The blue light BLs1 and the fluorescence YL are emitted from the polarization separation element 50 toward the respective directions the same as each other, and thus, there is formed the white illumination light WL including the blue light BLs1 and the fluorescence (the yellow light) YL mixed with each other.

The illumination light WL is emitted toward the integrator optical system 31. The integrator optical system 31 is constituted by, for example, a lens array 31a, and a lens array 31b. The lens arrays 31a, 31b are each formed of what has a plurality of small lenses arranged in an array.

The illumination light WL having been transmitted through the integrator optical system 31 enters the polarization conversion element 32. The polarization conversion element 32 is constituted by a polarization separation film and a wave plate. The polarization conversion element 32 converts the illumination light WL including the fluorescence YL as the non-polarized light into linearly polarized light.

The illumination light WL having been transmitted through the polarization conversion element 32 enters the superimposing lens 33. The superimposing lens 33 homogenizes the distribution of the illuminance due to the illumination light WL in the illumination target area in cooperation with the integrator optical system 31. The illumination device 2 emits the illumination light WL in such a manner as described above.

Wavelength Conversion Element

Figure 3:
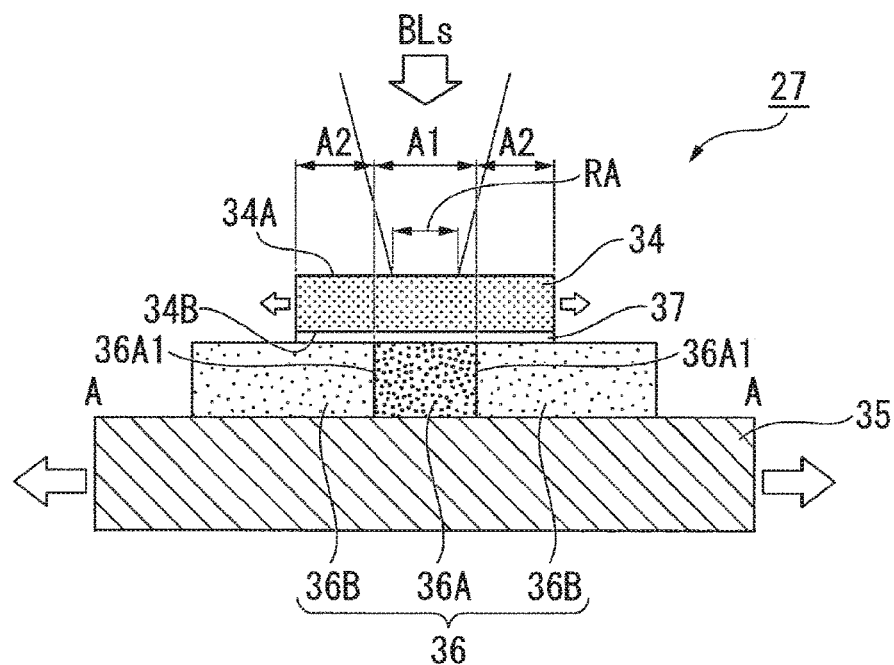
FIG. 3 is a cross-sectional view showing a configuration of a wavelength conversion element.
Figure 4:
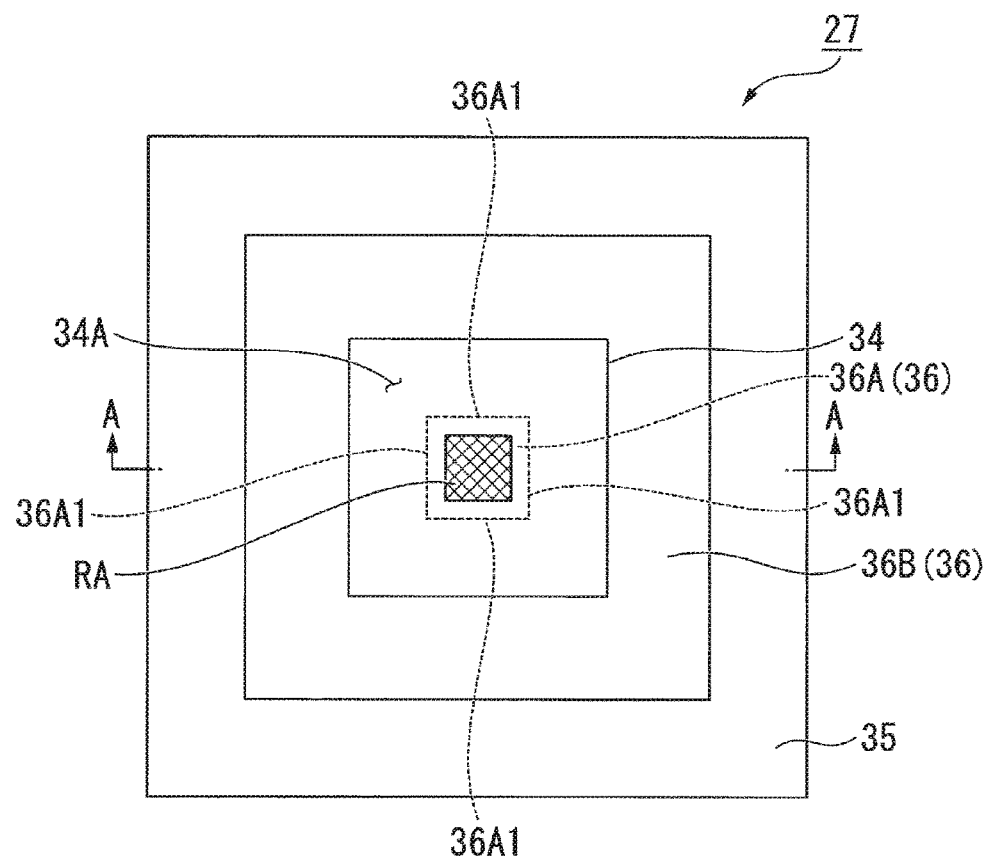
FIG. 4 is a plan view showing the configuration of the wavelength conversion element.

FIG. 3 is a cross-sectional view showing a configuration of the wavelength conversion device 27. FIG. 4 is a plan view showing the configuration of the wavelength conversion device 27. It should be noted that FIG. 3 corresponds to a cross-section in the arrow view along the line A-A shown in FIG. 4. In FIG. 3, the pencil BLs entering the plane of incidence 34A of the phosphor layer 34 is illustrated.

As shown in FIG. 2, the wavelength conversion element 27 emits the fluorescence YL, which is generated by performing the wavelength conversion on the pencil BLs entering the wavelength conversion element 27 from the first light collection optical system 26, toward the first light collection optical system 26. In the present embodiment, the fluorescence YL is the yellow light with the wavelength in a range of, for example, 500 through 700 nm.

As shown in FIG. 3, the wavelength conversion element 27 has the phosphor layer 34, a substrate 35 for supporting the phosphor layer 34, a bonding layer 36 for bonding the phosphor layer 34 and the substrate 35 to each other, and a reflecting layer 37.

In the present embodiment, the phosphor layer 34 is formed of a ceramic phosphor, for example, a YAG ceramic based phosphor obtained by sintering a plurality of YAG phosphor particles. The phosphor layer 34 formed of such a ceramic phosphor is made superior in heat resistance. Therefore, the wavelength conversion element 27 equipped with the phosphor layer 34 is also made superior in heat resistance.

The phosphor layer 34 has a plane of incidence 34A which the pencil BLs enters, a lower surface 34B opposed to the plane of incidence 34A. In the present embodiment, the pencil BLs corresponds to "excitation light" in the appended claims, the phosphor layer 34 corresponds to a "wavelength conversion layer" in the appended claims, the plane of incidence 34A corresponds to a "first surface" in the appended claims, and the lower surface 34B corresponds to a "second surface" in the appended claims.

A part of the fluorescence YL generated in the phosphor layer 34 is emitted from the plane of incidence 34A to the outside, the rest of the fluorescence YL is reflected by the reflecting section 37 to be emitted to the outside of the phosphor layer 34. As the reflecting section 37, what is high in reflectance is preferable, and a dielectric multilayer film is used in the present embodiment. It should be noted that as the reflecting section 37, it is possible to use a silver film or the like with which the high reflectance can be obtained with respect to the fluorescence YL. In such a manner, the fluorescence YL is emitted from the plane of incidence 34A of the phosphor layer 34 toward the first light collection optical system 26.

As shown in FIG. 4, in the case of the planar view of the wavelength conversion element 27 viewed from the surface normal direction of the plane of incidence 34A, the phosphor layer 34 is formed to have a roughly rectangular shape. In the present embodiment, the pencil BLs enters a partial area including the enter of the plane of incidence 34A. Hereinafter, the area which the pencil BLs enters in the plane of incidence 34A is called an excitation light irradiation area RA. The excitation irradiation area RA has a roughly rectangular shape.

As the substrate 35, it is preferable to use metal high in thermal conductivity such as Al (aluminum), Cu (copper), or Ag (silver), ceramic AlN, diamond, $Al_2O_3$, or the like, and in the present embodiment, a copper plate is used as the substrate 35 on the grounds of the high thermal conductivity. It should be noted that it is also possible to apply a surface treatment such as plating for enhancing the bonding strength with the bonding layer 36 to the surface of the substrate 35.

Bonding Layer

In the present embodiment, the bonding layer 36 has a first bonding material 36A and a second bonding material 36B. As shown in FIG. 3, the first bonding material 36A is disposed in a first region A1 in a lower surface 34B of the phosphor layer 34. The second bonding material 36B is disposed in a second region A2 in the lower surface 34B of the phosphor layer 34.

The first region A1 is a region opposed to the excitation light irradiation area RA in the lower surface 34B. In the present embodiment, the first region A1 has a roughly rectangular shape similarly to the excitation light irradiation area RA. The area of the first region A1 is larger than the area of the excitation light irradiation area RA.

As shown in FIG. 4, the second region A2 is a region located on the periphery of the first region A1. The second bonding material 36B is disposed on the outer periphery of the first bonding material 36A having a rectangular shape.

Here, the expression that the second bonding material 36B is disposed on the outer periphery of the first bonding material 36A denotes the state in which the second bonding material 36B is disposed surrounding the first bonding material 36A so as to have contact with side surfaces 36A1 of the first bonding material 36A, namely the four side surfaces 36A1 of the first bonding material 36A in the present embodiment. In the present embodiment, the second bonding material 36B is disposed on the substrate 35 in the state of running off the lower surface 34B (the second region A2) of the phosphor layer 34.

In the present embodiment, the Young's modulus of the second bonding material 36B is lower than the Young's modulus of the first bonding material 36A. The materials of the first bonding material 36A and the second bonding material 36B are selected from organic materials satisfying the relationship of the Young's modulus described above. For example, epoxy resin (Young's modulus: 2.0 GPa, thermal conductivity: 0.3 W/(mk)) is used as the material of the first bonding material 36A, and silicone (Young's modulus: $1.1 \times 10^{-3}$ GPa, thermal conductivity: 0.2 W/(mk)) is used as the material of the second bonding material 36B. In the present embodiment, the thermal conductivity of the first bonding material 36A is higher than the thermal conductivity of the second bonding material 36B.

Based on such a configuration described above, in the bonding layer 36 of the present embodiment, the Young's modulus of the peripheral part (the second region A2) in the phosphor layer 34 is made relatively lower than the Young's modulus of the central part (the first region A1) in the phosphor layer 34.

Incidentally, when the excitation light irradiation area RA on the plane of incidence 34A of the phosphor layer 34 is irradiated with the excitation light (the pencil BLs), the temperature of the phosphor layer 34 rises. The heat of the phosphor layer 34 is transmitted to the substrate 35 via the bonding layer 36.

Here, since the phosphor layer 34 and the substrate 35 are different in thermal expansion coefficient from each other, when irradiated with the excitation light, there occurs the thermal stress corresponding to the difference in thermal expansion coefficient. It should be noted that the thermal expansion coefficient is a concept including the linear expansion coefficient and the volume expansion coefficient, but in the present embodiment, the thermal expansion coefficient is assumed as the linear expansion coefficient in the following description since the phosphor layer 34, the substrate 35 and the bonding layer 36 are small in thickness.

FIG. 3 is for explaining the state of the wavelength conversion element 27 in the case in which the temperature of the phosphor layer 34 is rising. As shown in FIG. 3, an amount of the expansion (a displacement) of the substrate 35 becomes larger than an amount of the expansion (a displacement) of the phosphor layer 34.

On this occasion, there is a possibility that the phosphor layer 34 is broken or separated from the substrate 35 due to the thermal stress generated in the phosphor layer 34. It should be noted that the expansion (displacement) due to the heat of the phosphor layer 34, the substrate 35 and the bonding layer 36 is caused by the heat generated when the pencil BLs (the excitation light) is wavelength-converted into the fluorescence YL. Therefore, the expansion (displacement) due to the heat of the phosphor layer 34, the substrate 35 and the bonding layer 36 occurs centering on the excitation light irradiation area RA. Therefore, since the expansion amount (the displacement) increases in accordance with the distance from the starting point of the expansion (displacement), the expansion amount (the displacement) of the phosphor layer 34 is larger in the peripheral part (the second region A2) than in the central part (the first region A1) of the phosphor layer 34.

The wavelength conversion element 27 according to the present embodiment described hereinabove exerts the following advantages.

In the wavelength conversion element 27 according to the present embodiment, the Young's modulus of the second bonding material 36B disposed in the peripheral part (the second region A2) of the phosphor layer 34 is made relatively low. In other words, the Young's modulus of the second bonding material 36B corresponding to the area large in expansion amount (displacement) in the phosphor layer 34, namely the area where relatively strong thermal stress occurs in the phosphor layer 34, is made lower than the Young's modulus of the first bonding material 36A. Thus, the thermal stress generated in the phosphor layer 34 is reduced. Therefore, it is possible to make the damage (breakage of the phosphor layer 34 or the separation of the phosphor layer 34 from the substrate 35) of the wavelength conversion element 27 due to the thermal stress difficult to occur.

When irradiated with the excitation light, the temperature becomes the highest in the excitation light irradiation area RA of the plane of incidence 34A. In the lower surface 34B of the phosphor layer 34, the temperature becomes the highest in the region (the first region A1) opposed to the excitation light irradiation area RA.

In the bonding layer 36 of the present embodiment, the first bonding material 36A higher in thermal conductivity than the second bonding material 36B is disposed in the first region A1 opposed to the excitation light irradiation area RA, namely the region where the temperature becomes the highest in the lower surface 34B of the phosphor layer 34. Therefore, the first bonding material 36A efficiently conducts the heat of the excitation light irradiation area RA toward the substrate 35. Therefore, since the heat is efficiently released from the phosphor layer 34 toward the substrate, the rise in temperature of the phosphor layer 34 is suppressed, and thus, thus the deterioration of the wavelength conversion efficiency of the phosphor layer 34 can be prevented.

According to the projector 1 described hereinabove, the following advantages are exerted.

Since the region relatively large in displacement in the phosphor layer 34 is bonded to the substrate 35 using the second bonding material 36B low in Young's modulus, the thermal stress generated in the phosphor layer 34 can be reduced. Thus, the breakage of the phosphor layer 34 or the separation of the phosphor layer 34 from the substrate 35 due to the heat can be made difficult to occur.

Further, since the first bonding material 36A high in thermal conductivity is disposed in the region heated to the highest temperature of the lower surface 34B of the phosphor layer 34, it is possible to prevent the deterioration of the wavelength conversion efficiency of the phosphor layer 34 by suppressing the rise in temperature of the phosphor layer 34.

Further, since the wavelength conversion element 27 is provided with the phosphor layer 34 formed of the ceramic phosphor, it is possible to provide the wavelength conversion element superior in heat resistance.

The light source device 2A is capable of reducing the damage due to the heat, and at the same time preventing the deterioration of the wavelength conversion efficiency, and can therefore stably emit the illumination light WL. Further, since the illumination device 2 including the light source device 2A stably emits the illumination light WL, it is possible to enhance the reliability of the projector 1 according to the present embodiment equipped with the illumination device 2, and at the same time it is possible to make the projector 1 high-luminance.

Second Embodiment

Then, an illumination device according to a second embodiment will be described. The present embodiment and the first embodiment are difference from each other in the configuration of the wavelength conversion element, and the other configurations are common to the both embodiments. Therefore, in the following description, the configuration of the wavelength conversion element will mainly be described, and the configurations and the members common to the first embodiment and the present embodiment will be denoted by the same reference symbols, and the detailed description thereof will be omitted, or simplified.

Figure 5:
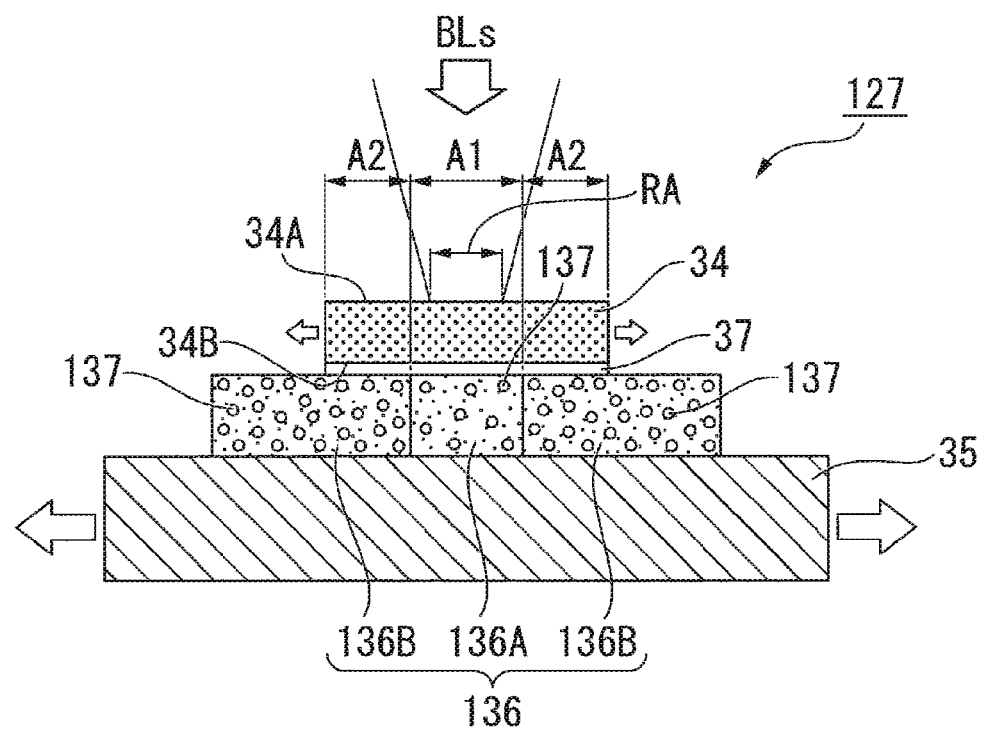
FIG. 5 is a cross-sectional view showing a configuration of a wavelength conversion element according to a second embodiment of the invention.

FIG. 5 is a cross-sectional view showing a configuration of the wavelength conversion element 127 of the present embodiment. As shown in FIG. 5, the wavelength conversion element 127 has the phosphor layer 34, the substrate 35 for supporting the phosphor layer 34, a bonding layer 136 for bonding the phosphor layer 34 and the substrate 35 to each other, and the reflecting layer 37.

The bonding layer 136 has a first bonding material 136A and a second bonding material 136B. In the present embodiment, the first bonding material 136A and the second bonding material 136B are formed of the same material including voids 137. As the material constituting the first bonding material 136A and the second bonding material 136B, there is used sintered metal.

In the present embodiment, the first bonding material 136A and the second bonding material 136B include a plurality of voids 137. Here, the Young's modulus of the bonding material varies due to the void ratio in the bonding material. Specifically, in the case in which the void ratio rises, the space in the bonding material increases due to the voids, and therefore, the bonding material becomes easy to be deformed by external force. Therefore, in the case in which the void ratio increases, the Young's modulus of the bonding material lowers.

In the present embodiment, as the sintered metal constituting the first bonding material 136A, there is used, for example, an Ag nanoparticle bonding material (Young's modulus: 14.8 GPa, thermal conductivity: 213 W/(mk)).

In the present embodiment, the second bonding material 136B is formed by using the same material (the Ag nanoparticle bonding material) as in the first bonding material 136A, and adjusting the void ratio of the material. Specifically, the second bonding material 136B is formed using the Ag nanoparticle bonding material with the void ratio made higher than in the first bonding material 136A.

It should be noted that the void ratio of the sintered metal can be controlled by, for example, controlling the size of the particle diameter of the metal particles to be sintered, or providing a temperature distribution to control the progress of the sintering.

The second bonding material 136B formed in such a manner becomes higher in void ratio (void amount) than the first bonding material 136A. Therefore, the Young's modulus of the second bonding material 136B becomes lower than the Young's modulus (14.8 GPa) of the first bonding material 136A described above.

According to the bonding layer 136 of the present embodiment, the Young's modulus of the peripheral part (the second bonding material 136B) in the phosphor layer 34 is made relatively lower than the Young's modulus of the central part (the first bonding material 136A) in the phosphor layer 34.

The sintered metal (the Ag nanoparticle bonding material) is a material superior in thermal conductivity. However, the sintered metal lowers in thermal conductivity as the void ratio rises. This is because the space generated in the sintered metal increases as the void ratio rises, and therefore, it becomes difficult to conduct heat.

In the present embodiment, the second bonding material 136B is higher in void ratio than the first bonding material 136A. Therefore, the thermal conductivity of the first bonding material 136A is higher than the thermal conductivity of the second bonding material 136B.

The wavelength conversion element 127 according to the present embodiment described hereinabove exerts the following advantages.

Since the second bonding material 136B low in Young's modulus is disposed in the region (the region in which strong thermal stress is generated) large in displacement in the phosphor layer 34, the thermal stress generated in the phosphor layer 34 can be reduced similarly to the first embodiment. Therefore, the breakage of the phosphor layer 34 or the separation of the phosphor layer 34 from the substrate 35 due to the thermal stress is difficult to occur.

In the present embodiment, by controlling the void ratios, it is possible to form the first bonding material 136A and the second bonding material 136B using the same material. Therefore, since the bonding layer is formed of the single material, it is possible to achieve cost reduction compared to the case of using two materials.

Further, since the first bonding material 136A high in thermal conductivity is disposed in the region heated to a high temperature in the lower surface 34B of the phosphor layer 34, it is possible to prevent the deterioration of the wavelength conversion efficiency of the phosphor layer 34 by suppressing the rise in temperature of the phosphor layer 34.

It should be noted that the invention is not limited to the contents of the embodiments described above, but can arbitrarily be modified within the scope or the spirit of the invention.

The materials constituting the first bonding material and the second bonding material are not limited to the configurations of the embodiments described above. Any combinations of the materials for constituting the first bonding material and the second bonding material satisfying the relationship of the Young's modulus described above can arbitrarily be adopted. For example, the materials constituting the first bonding material and the second bonding material are each selected from either one of organic materials, organic materials including fillers, solder, and the sintered metal. Hereinafter, as modified examples, the combinations of the materials constituting the first bonding material and the second bonding material will be described.

First Modified Example

In the bonding material related to a first modified example, a material obtained by including a filler in an organic material is used as the first bonding material, and an organic material is used as the second bonding material. As the material obtained by including the filler in the organic material, it is possible to use, for example, epoxy resin including an Ag filler (Young's modulus: 1.3 GPa, thermal conductivity: 20 W/(mk)). Further, as the organic material, it is possible to use, for example, silicone described above.

Second Modified Example

In the bonding material related to a second modified example, a material obtained by including a filler in an organic material is used as the first bonding material, and a material obtained by including a filler in an organic material is used as the second bonding material. It should be noted that as long as the relationship of the Young's modulus is satisfied, either one of the organic material and the filler included in the second bonding material can be the same as either one of the organic material and the filler included in the first bonding material.

Third Modified Example

In the bonding material related to a third modified example, sintered metal is used as the first bonding material, and an organic material is used as the second bonding material. As the sintered metal, it is possible to use, for example, the Ag nanoparticle bonding material described above. Further, as the organic material, it is possible to use, for example, the epoxy resin or silicone described above.

Fourth Modified Example

In the bonding material related to a fourth modified example, sintered metal is used as the first bonding material, and a material obtained by including a filler in an organic material is used as the second bonding material. As the sintered metal, it is possible to use, for example, the Ag nanoparticle bonding material described above. Further, as the material obtained by including the filler in the organic material, it is possible to use, for example, the epoxy resin including the Ag filler described above.

Fifth Modified Example

In the bonding material related to a fifth modified example, sintered metal is used as the first bonding material, and solder is used as the second bonding material. As the sintered metal, it is possible to use, for example, the Ag nanoparticle bonding material described above. Further, as the solder, it is possible to use, for example, indium (Young's modulus: 11 GPa, thermal conductivity: 81 W/(mk)).

Sixth Modified Example

In the bonding material related to a sixth modified example, solder is used as the first bonding material, and an organic material is used as the second bonding material. As the solder, it is possible to use, for example, indium described above. Further, as the organic material, it is possible to use, for example, the epoxy resin or silicone described above.

Seventh Modified Example

In the bonding material related to a seventh modified example, solder is used as the first bonding material, and a material obtained by including a filler in an organic material is used as the second bonding material. As the solder, it is possible to use, for example, indium described above. Further, as the material obtained by including the filler in the organic material, it is possible to use, for example, the epoxy resin including the Ag filler described above.

Eighth Modified Example

In the bonding material related to an eighth modified example, solder is used as the first bonding material and the second bonding material. It should be noted that it is sufficient to combine the solder constituting the first bonding material and the solder constituting the second bonding material with each other so as to satisfy the relationship of the Young's modulus described above. Further, it is also possible to use the same material as the solder constituting the first bonding material and the solder constituting the second bonding material, and to satisfy the relationship of the Young's modulus described above by making the void ratio of the second bonding material higher than the void ratio of the first bonding material.

It should be noted that in the case of using indium described above as the second bonding material, it is possible to use Sn-0.75Cu, Sn-0.3Ag-0.7Cu, Sn-1Ag-0.5Cu, Sn-9Zn, Sn-8Zn-3Bi, Sn-58Bi, Sn-57Bi-1Ag, Sn-37Pb, Sn-95Pb, or the like as the first bonding material.

Ninth Modified Example

In the bonding material related to a ninth modified example, solder is used as the first bonding material, and sintered metal is used as the second bonding material. As the solder, it is possible to use, for example, indium described above. Further, as the sintered metal, it is possible to use, for example, the Ag nanoparticle bonding member with the void ratio set so that the Young's modulus is lower than that of the solder (indium).

Further, in the embodiments described above, there is cited the case in which the first bonding material 36A and the second bonding material 36B constituting the bonding layer 36 are each formed of a single region, but the invention is not limited to this example.

For example, it is also possible for the second bonding material 36B to be constituted by two regions separated from each other, and each disposed so as to have contact with the outer circumference (the side surfaces 36A1) of the first bonding material 36A formed of a single region.

Further, in the embodiments described above, there is cited the case in which the excitation light irradiation area RA is formed to have a roughly rectangular shape, but the invention is not limited to this example. A roughly circular shape or a polygonal shape can also be adopted.

Further, although in the embodiments described above, there is illustrated the projector 1 provided with the three light modulation devices 4R, 4G, and 4B, the invention can also be applied to a projector for displaying a color picture with a single light modulation device. Further, a digital mirror device can also be used as the light modulation device.

Further, although in the embodiments described above, there is described the example of installing the light source device according to the invention in the projector, the invention is not limited to this example. The light source device according to the invention can also be applied to lighting equipment, a headlight of a vehicle, and so on.

The entire disclosure of Japanese Patent Application No. 2017-167031, filed on Aug. 31, 2017 is expressly incorporated by reference herein.

What is claimed is:

1. A wavelength conversion element comprising:
   a wavelength conversion layer having a first surface which excitation light enters, and a second surface opposed to the first surface, and adapted to perform wavelength conversion on the excitation light;
   a substrate disposed so as to be opposed to the second surface; and
   a bonding layer adapted to bond the wavelength conversion layer and the substrate to each other, wherein
   the bonding layer has a first bonding material disposed in a first region opposed to an incident area of the excitation light in the second surface, and a second bonding material disposed in at least a second region located on an outer periphery of the first region and lower in Young's modulus than the first bonding material,
   thermal conductivity of the first bonding material is higher than thermal conductivity of the second bonding material,
   the first bonding material and the second bonding material are formed of the same material including voids, and
   a void ratio in the first bonding material is lower than a void ratio in the second bonding material.

2. The wavelength conversion element according to claim 1, wherein
   the wavelength conversion layer is formed of a ceramic phosphor.

3. A light source device comprising:
   wavelength conversion element according to claim 2; and
   a light emitting element adapted to emit the excitation light.

4. A projector comprising:
   the light source device according to claim 3;
   a light modulation device adapted to modulate light from the light source device in accordance with image information to form image light; and
   a projection optical device adapted to project the image light.

5. A light source device comprising:
   the wavelength conversion element according to claim 1; and
   a light emitting element adapted to emit the excitation light.

6. A projector comprising:
   the light source device according to claim 5;
   a light modulation device adapted to modulate light from the light source device in accordance with image information to form image light; and
   a projection optical device adapted to project the image light.

7. A wavelength conversion element comprising:
   a wavelength conversion layer having a first surface which excitation light enters, and a second surface opposed to the first surface, and adapted to perform wavelength conversion on the excitation light;
   a substrate disposed so as to be opposed to the second surface; and
   a bonding layer adapted to bond the wavelength conversion layer and the substrate to each other, wherein
   the bonding layer has a first bonding material disposed in a first region opposed to an incident area of the excitation light in the second surface, and a second bonding material disposed in at least a second region located on an outer periphery of the first region and lower in Young's modulus than the first bonding material,
   the first bonding material and the second bonding material are formed of the same material including voids, and
   a void ratio in the first bonding material is lower than a void ratio in the second bonding material.

8. The wavelength conversion element according to claim 7, wherein thermal conductivity of the first bonding material is higher than thermal conductivity of the second bonding material.

9. The wavelength conversion element according to claim 7, wherein
the wavelength conversion layer is formed of a ceramic phosphor.

10. A light source device comprising:
the wavelength conversion element according to claim 7; and
a light emitting element adapted to emit the excitation light.

11. A projector comprising:
the light source device according to claim 10;
a light modulation device adapted to modulate light from the light source device in accordance with image information to form image light; and
a projection optical device adapted to project the image light.

12. A wavelength conversion element comprising:
a wavelength conversion layer having a first surface which excitation light enters, and a second surface opposed to the first surface, and adapted to perform wavelength conversion on the excitation light;
a substrate disposed so as to be opposed to the second surface; and
a bonding layer adapted to bond the wavelength conversion layer and the substrate to each other, wherein
the bonding layer has a first bonding material disposed in a first region opposed to an incident area of the excitation light in the second surface, and a second bonding material disposed in at least a second region located on an outer periphery of the first region and lower in Young's modulus than the first bonding material,
the first bonding material includes a side surface that intersects the second surface, and
the second bonding material is disposed on the side surface and is in contact with the side surface.

13. The wavelength conversion element according to claim 12, wherein
thermal conductivity of the first bonding material is higher than thermal conductivity of the second bonding material.

14. The wavelength conversion element according to claim 13, wherein
the first bonding material and the second bonding material are formed of the same material including voids, and
a void ratio in the first bonding material is lower than a void ratio in the second bonding material.

15. The wavelength conversion element according to claim 12, wherein
the first bonding material and the second bonding material are formed of the same material including voids, and
a void ratio in the first bonding material is lower than a void ratio in the second bonding material.

16. The wavelength conversion element according to claim 12, wherein
the wavelength conversion layer is formed of a ceramic phosphor.

17. A light source device comprising:
the wavelength conversion element according to claim 12; and
a light emitting element adapted to emit the excitation light.

18. A projector comprising:
the light source device according to claim 17;
a light modulation device adapted to modulate light from the light source device in accordance with image information to form image light; and
a projection optical device adapted to project the image light.

* * * * *